United States Patent [19]

Faa, Jr.

[11] Patent Number: 4,669,028
[45] Date of Patent: May 26, 1987

[54] HEAT SINK FOR SOLID STATE DEVICES CONNECTED TO A CIRCUIT BOARD

[75] Inventor: Leland M. Faa, Jr., Columbia, S.C.

[73] Assignee: NCR Corporation, Dayton, Ohio

[21] Appl. No.: 830,026

[22] Filed: Feb. 18, 1986

[51] Int. Cl.⁴ .............................................. H05K 7/20
[52] U.S. Cl. .................... 361/386; 165/80.3; 165/185; 174/16 HS; 361/388; 357/81
[58] Field of Search ................. 165/80 A, 80.2, 80 B, 165/80.3, 185; 174/16 HS; 357/79, 81; 361/386–388, 417–420, 427; 363/141

[56] References Cited

U.S. PATENT DOCUMENTS

| 3,200,296 | 8/1965 | Bruestle | 361/417 |
| 3,568,761 | 3/1971 | Berger | 361/388 |
| 3,641,474 | 2/1972 | Owens | 357/81 |
| 3,796,254 | 3/1974 | Stooksberry et al. | 165/185 |
| 4,012,769 | 3/1977 | Edwards et al. | 174/16 HS |
| 4,288,839 | 9/1981 | Prager et al. | 361/387 |

OTHER PUBLICATIONS

Joy, "Power Transistor Heat Sink Clamp Plate", IBM Technical Disclosure Bulletin, vol. 26, No. 10A, 3/84, pp. 5184–5185.

Primary Examiner—A. D. Pellinen
Assistant Examiner—Gregory P. Thompson
Attorney, Agent, or Firm—Wilbert Hawk, Jr.; Edward Dugas

[57] ABSTRACT

The present invention removably mounts a plurality of solid state devices and a circuit board to a chassis heat sink by utilizing a heat conductive device formed with a base and a leg portion with the leg portion extending from the base and having a first relatively flat surface and an angled end position. The base of the device is adapted to be mounted to a chassis heat sink and the relatively flat surface is adapted to contact one side of each of the plurality of solid state devices. A number of cap members having an inverted L-shaped cross section, with first leg portions and second leg portions are provided with an angled surface for mating with the angled end portion such that the first leg portions are substantially parallel to the first relatively flat surface. A fastener member is provided for urging the first leg portions of the cap member toward the first relatively flat surface for sandwiching the plurality of solid state devices in thermal contact with the heat conductive device and the number of cap members.

8 Claims, 2 Drawing Figures

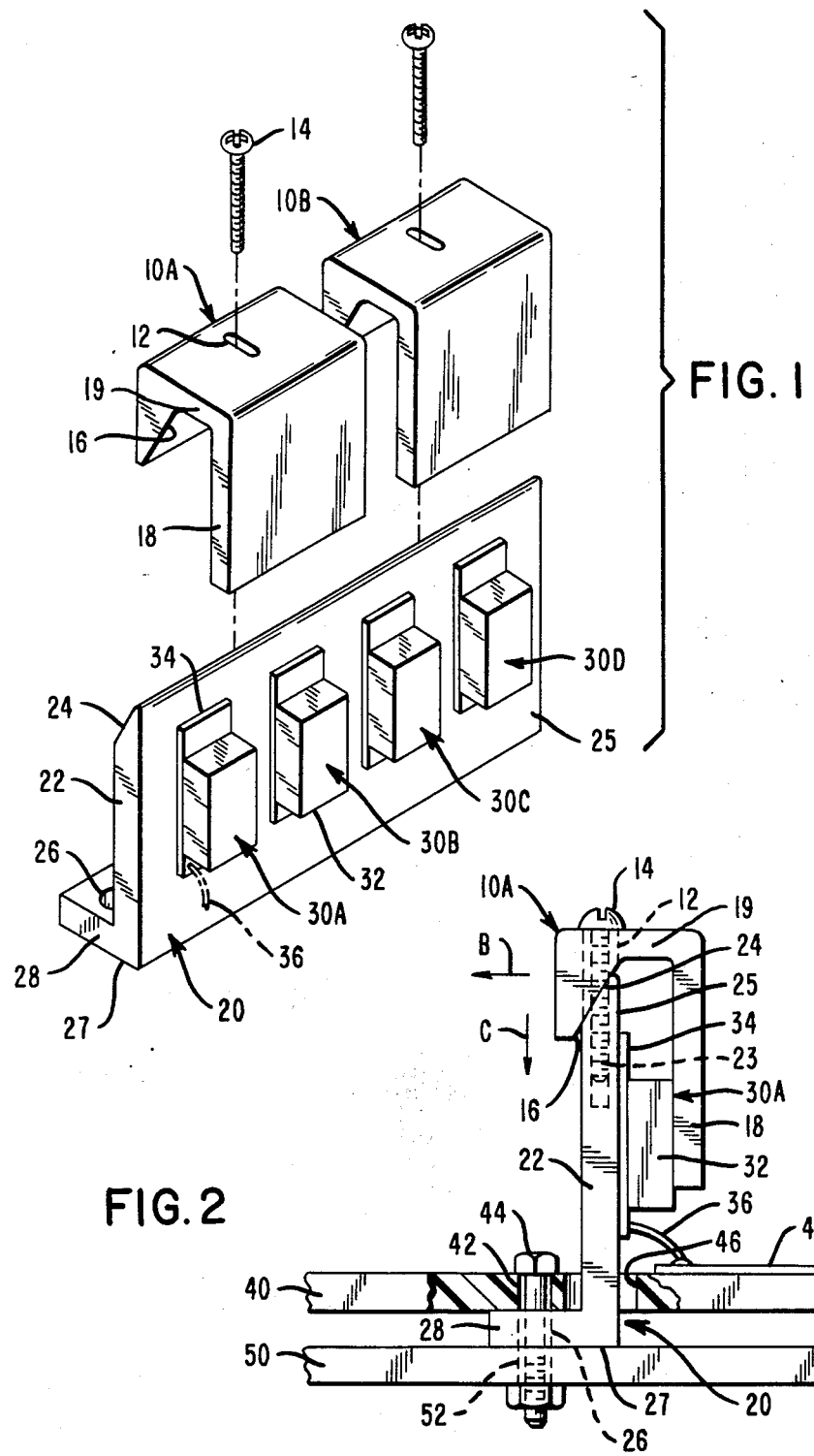

HEAT SINK FOR SOLID STATE DEVICES CONNECTED TO A CIRCUIT BOARD

BACKGROUND OF THE INVENTION

The present invention relates to a heat sink which mounts on a chassis and supports a circuit board. The heat sink also mounts at least one solid state device in proximity to the circuit board such that electrical connections from the solid state device to the circuit board are made without strain on the connections.

In present day power supplies, various components generate amounts of heat which cannot be adequately transferred to the ambient surroundings without the utilization of a heat sink. Printed circuit boards are used to provide a support for the electrical conductors and the associated electrical components, generally solid state devices, that make up the power supply. The high heat generating components are mounted to large heat sinks remote from the printed circuit board. This remote mounting is traditionally called "off-board" mounting. In order to have an effective transfer of heat from the solid state device to the heat sink the solid state device must be securely clamped to the heat sink. It is also highly desirable to have the solid state device mounted to the heat sink with a device that will permit its easy removal from the heat sink and also from the associated circuit board in case of component failure. It is also desirable to have the solid state device (heat generating device) in close proximity to its associated circuit board, so as to minimize the length of the conductors required for connecting the solid state device to the circuit board.

In U.S. Pat. No. 3,366,171, entitled "Heat Sink For Semi-Conductor Elements", by O. Scharli, there is disclosed a heat sink shaped as a right circular cylinder on its outer surface and having a tapered hexagon inner surface extending from one end to the other. Three semiconductor elements are pressed against flat portions of the inner surface by a truncated cone shaped element, which has a bolt assembly for urging the cone toward the narrow end of the inner surface so as to effectively wedge the semiconductor elements into thermal contact with the heat sink.

In U.S. Pat. No. 4,193,444, entitled "Electrical Mounting Means For Thermal Conduction", by R. L. Boyd et al., there is disclosed a U-shaped metal supporting element which has a tapered surface adjacent to the bottom of the U-shape, which tapered surface is designed to frictionally engage with a large complementary U-shaped member, such that pressure, exerted on the upper U-shaped member, causes the frictional engagement surfaces to experience an increased engagement force. A spring is used to provide the downward pressure instead of a bolt or screw type fastener so as to minimize fluctuations in the engagement force caused by thermal cycling of the components.

Another patent of interest for its teaching is U.S. Pat. No. 4,204,248, entitled "Heat Transfer Mounting Arrangement for a Solid State Device Connected to a Circuit Board", by D. S. Proffit et al. In this patent a solid state device is fastened to a metallic heat sink which heat sink, in turn, is connected to a chassis in close proximity to a like mounted circuit board, such that the electrical leads from the solid state device may be connected to the printed circuit board without strain.

Still another device of interest is disclosed in U.S. Pat. No. 4,475,145, entitled "Circuit Board Heatsink Assembly and Technique", by D. L. Heil et al. In this patent there is disclosed a device for increasing the heat transfer between a circuit board and a metal chassis acting as a heat sink. The device is comprised of two wedges, one of which contains an elongated opening and the other of which contains a circular opening. A fastener (machine screw) passing through the wedge openings engages a portion of the chassis and when drawn down causes the wedge with the elongated opening to move in a direction which increases the engagement force between a captured portion of a circuit board and the chassis.

SUMMARY OF THE INVENTION

In the preferred embodiment of this invention there is provided a thermally conductive L-shaped support body having, a first flat surface for abutting to a first surface of at least one solid state device, and an angled end portion and a second flat surface for abutting to a chassis. There is also provided at least one thermally conductive cap member having an inverted L-shaped cross section, with a first leg portion of the cap member having an angled surface for mating to the angled end portion of the support body and the second leg portion adapted to contact a second surface of the at least one solid state device, for sandwiching the solid state device against the first flat surface of the support body as a fastener member draws the cap member into engagement with the support member at the mated angled surfaces. For disassembly, the fastener member is loosened and the solid state device is disconnected from the circuit board and the heat sink device.

Removal of the cap member permits the solid state device to be removed from the circuit board. Forming both the cap member and the support body of a thermally conductive material permits the removal of heat from both surfaces of the solid state device.

From the foregoing it can be seen that it is a primary object of the present invention to provide an improved heat sink for use with solid state devices, a circuit board, and a chassis.

It is another object of the present invention to provide a heat sink which can hold a multiplicity of solid state devices while permitting the easy removal of an individual solid state device without disruption to the remainder of the mounted devices.

It is a further object of the present invention to provide a heat sink device for use with off-board mounted solid state devices and a printed circuit board to facilitate the replacement of a defective solid state device.

These and other objects of the present invention will become more apparent when taken in conjunction with the following description and drawings, throughout which like characters indicate like parts and which drawings form a part of this application.

BRIEF DESCRIPTION OF THE DRAWINGS

FIG. 1 is a perspective view, partially in exploded form, of the preferred embodiment of the invention.

FIG. 2 is an end view partially in section of the preferred embodiment of the invention.

DETAILED DESCRIPTION OF THE INVENTION

Referring to FIG. 1, an elongated thermally conductive, support body 20 is shown having a substantilly L-shaped cross section with a base portion 28 and a leg portion 22. The leg 22 portion has an angled end portion 24. In the preferred embodiment of the invention, the angle of the end portion 24 is approximately 30 degrees. Leg portion 22 has a first relatively flat surface 25 and base portion 28 has a second flat surface 27. A plurality of thermally conductive cap members 10A and 10B, each having an L-shaped cross section, formed from a first leg portion 18 and a second leg portion 19, provided with an angled surface 16 that is designed to mate with the angled end portion 24 of support body 20. An elongated opening 12, in each cap member, is adapted to receive a fastener 14, which may be a bolt. The bolt 14 contacts a threaded fastener receptacle opening 23 in the leg 22 (shown in FIG. 2). Each top cap, in the preferred embodiment of the invention, has a width that permits two solid state devices such as 30A, 30B and 30C, 30D to be mounted by each cap member 10A and 10B, respectively. The cap members may be made wider or narrower in width to permit either more or less solid state devices to be mounted by each cap member.

Although not required, each solid state device 30A-30D, in the preferred embodiment, is comprised of a body section 32, a flat heat plate 34, and electrical conductors (leads) 36. The leads 36 extend from the solid state device to conductors 48 on an associated circuit board 40 (shown in FIG. 2).

Referring now to FIG. 2, a metallic chassis 50 provides a heat dissipating surface (sink) to which the thermally conductive support body 20 is attached. The leg 28 is provided with an opening 26 through which a fastener 44 is inserted and which fastener also passes through an opening 42 in a printed circuit board 40 and an opening 52 in the chassis 50. The fastener 44 therefore holds the second flat surface 27 of leg 28 in thermal contact with the chassis body 50, while also holding the printed circuit board 40 in a fixed relationship with respect to the chassis 50 and the support body 20. The leg 22 passes through an opening 46 in the circuit board 40.

To assemble the heat sink device, the solid state devices 30A, 30B and 30C, 30D are positioned between the legs 18 of cap members 10A and 10B, respectively and the first flat surface 25 of the leg 22. As the fastener 14 is tightened downwards into the threaded opening 23 of the leg 22, the angled surface 16 slides downwards at an angle which causes the cap member to move in the direction indicated by the direction of arrow B and in the direction indicated by the direction of arrow C. Movement in the B direction causes a force to be transmitted to the solid state devices, which urges the heat plate 34 of each solid state device into contact with the first flat surface 25 of the leg 22. Once mounted in this sandwiched fashion, the solid state devices can transmit heat upwards through the leg 18 and then down through the leg 22 and through the heat plate 34 to the leg 22, and hence downward into the chassis 50.

The leads 36 are soldered to the corresponding conductors 48 on the circuit board 40 and if necessary, to remove a defective solid state device the leads 36, can be easily de-soldered and the fastener 14 disengaged so that the defective component can be removed and a new component installed.

In the preferred embodiment of the invention, the support member 20 and the end caps 10A and 10B were formed of aluminum which aluminum was finished black anodized.

While there has been shown what is considered to be the preferred embodiment of the invention, it will be manifest that many changes and modifications may be made therein without departing from the essential spirit of the invention. It is intended, therefore, in the annexed claims, to cover all such changes and modifications as may fall within the true scope of the invention.

I claim:

1. A solid state device mounting and thermal conduction means comprising:
   a heat conductive device having a base and a leg portion, said leg portion extending from said base and having a first relatively flat surface and an angled end portion, the base of said heat conductive device contacting a heat dissipating surface;
   at least one cap member having an L-shaped cross section, with a first leg portion and a second leg portion, said second leg portion having an angled surface mating with the angled end portion of said heat conductive device such that the first leg portion is substantially parallel to said first relatively flat surface; and
   means urging the first leg portion of said at least one cap member toward said first relatively flat surface such that a solid state device may be sandwiched in thermal contact with said heat conductive device and said at least one cap member.

2. The solid state device mounting and thermal conductive means according to claim 1 wherein the leg portion of said heat conductive device extends from said base at substantially a right angle therewith.

3. The solid state device mounting and thermal conduction means according to claim 1 wherein said at least one cap member has an elongated opening through said second leg portion and wherein the leg portion of said head conductive device has a fastener receptacle formed through the angled end portion; and wherein said means urging being a fastener which extends through the elongated opening of said second leg portion to engage the fastener receptacle to said heat conductive device urging said cap member toward said first relative flat surface.

4. The solid state device mounting and thermal conduction means of claim 1 wherein said base has a second flat surface contacting the heat dissipating surface.

5. The solid state device mounting and thermal conduction means of claim 1 further comprising:
   a metallic chassis having said heat dissipating surface;
   a printed circuit board having conductors thereon attaching to electrical leads extending from the solid state device, said printed circuit board having at least one opening therethrough allowing the leg portion of said heat conductive device to pass therethrough; and
   fastener means mounting said printed circuit board and said heat conductive device to said metallic chassis such that the solid state device sandwiched between said cap member and said first relatively flat surface is mounted adjacent the conductors on said printed circuit board so as to enable connection of the electrical leads extending from said solid state device to associated conductors.

6. A solid state device mounting and thermal conduction means comprising:
   an elongated, heat conducting, support member having an L-shaped cross section;
   means affixing said support member to a heat sink;
   at least one cap member having an L-shaped cross section, said cap member and said support member having angled mating surfaces; and means urging the angled mating surface of said cap member into engagement with said angled surface of said support member so as to mount at least one solid state device between said support member and said at least one cap member.

7. The solid state device mounting and thermal conduction means according to claim 6 wherein said at least one cap member has an elongated opening therethrough and wherein a fastener receptacle is formed in said support member, and wherein said means urging is a fastener which extends through said elongated opening to engage the fastener receptacle in said support member urging said at least one cap member toward said support member.

8. The solid state device mounting and thermal conduction means of claim 7 further comprising:

a metallic chassis being said heat sink;

a printed circuit board having conductors thereon attaching to electrical leads extending from said at least one solid state device, said printed circuit board having at least one opening therethrough allowing a portion of said support member to pass therethrough; and fastener means mounting said printed circuit board and said support member to said metallic chassis such that the at least one solid state device mounted between said at least one cap member and said support member is mounted adjacent the conductors on said printed circuit board so as to enable connection of the electrical leads, extending from said at least one solid state device, to associated conductors on said printed circuit board.

* * * * *